United States Patent [19]

Fletcher et al.

[11] 4,091,329

[45] May 23, 1978

[54] LOGARITHMIC CIRCUIT WITH WIDE DYNAMIC RANGE

[76] Inventors: James C. Fletcher, Administrator of the National Aeronautics and Space Administration, with respect to the invention of; Paris H. Wiley; Eugene A. Manus, both of Blacksburg, Va.

[21] Appl. No.: 769,149

[22] Filed: Feb. 16, 1977

[51] Int. Cl.² ........................ H03K 17/00; G06G 7/24

[52] U.S. Cl. .................................... 328/145; 307/229; 307/230

[58] Field of Search ................ 328/144, 145; 307/229, 307/230, 310

[56] References Cited

U.S. PATENT DOCUMENTS

| | | | |
|---|---|---|---|
| 3,444,362 | 5/1969 | Pearlman | 328/145 |
| 3,465,168 | 9/1969 | Luhowy et al. | 307/230 |
| 3,569,739 | 3/1971 | Stolman | 307/229 |

*Primary Examiner*—Stanley D. Miller, Jr.
*Assistant Examiner*—B. P. Davis
*Attorney, Agent, or Firm*—Robert D. Marchant; John R. Manning; John O. Tresansky

[57] ABSTRACT

A circuit deriving an output voltage that is proportional to the logarithm of a DC input voltage susceptible to wide variations in amplitude includes a constant current source which forward biases a diode so that the diode operates in the exponential portion of its voltage versus current characteristic, above its saturation current. The constant current source includes first and second, cascaded feedback, DC operational amplifiers connected in a negative feedback circuit. An input terminal of the first amplifier is responsive to the input voltage. A circuit shunting the first amplifier output terminal includes a resistor in series with the diode. The voltage across the resistor is sensed at the input of the second DC operational feedback amplifier. The feedback voltage derived from the output of the second amplifier is subtracted by the first amplifier from the input voltage so that the current flowing through the resistor is proportional to the input voltage over the wide range of variations in amplitude of the input voltage.

4 Claims, 1 Drawing Figure

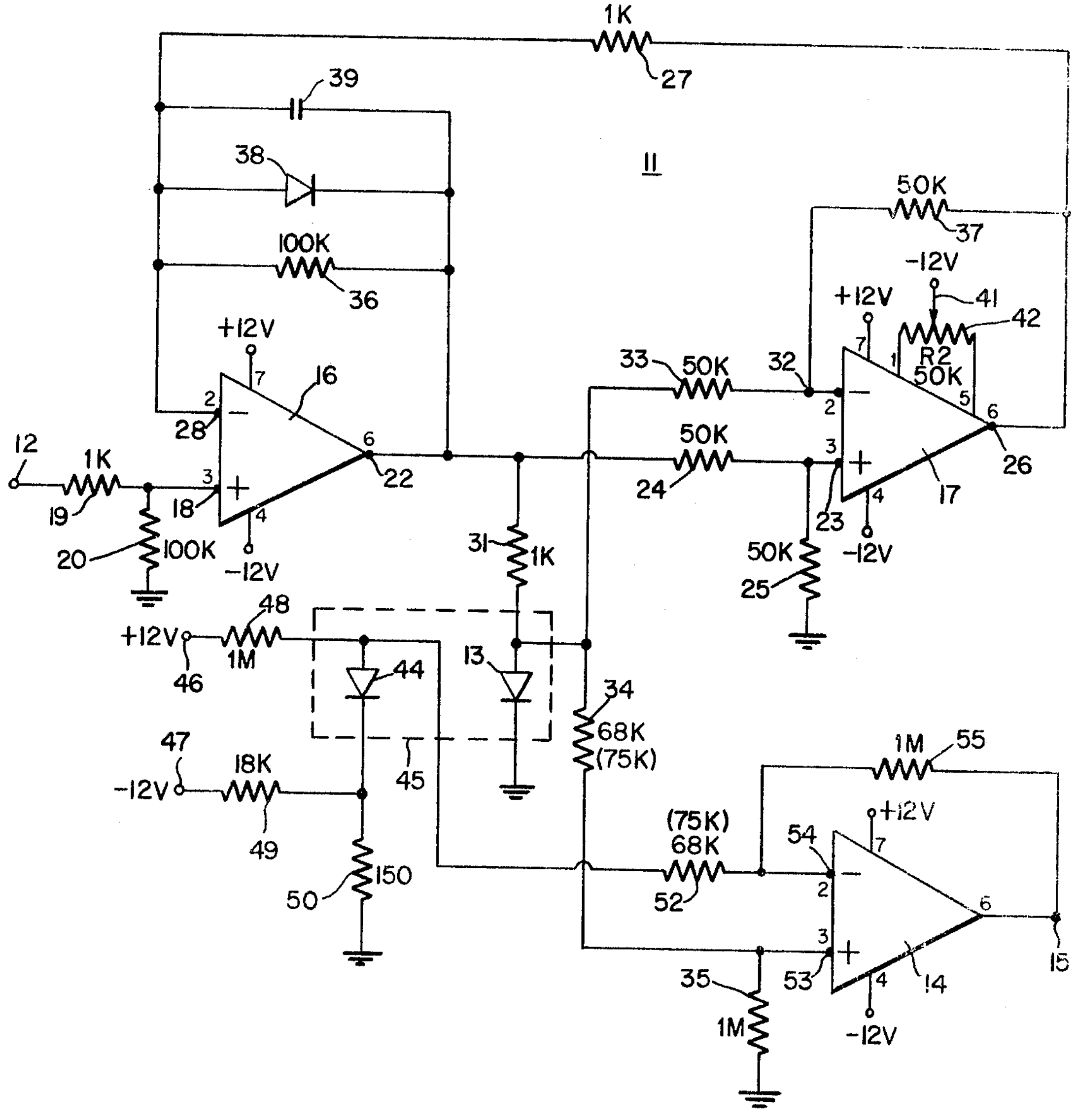
1K
27
39
38
11
100K
36
50K
37
-12V
41
+12V
42
R2
50K
+12V
16
33
50K
32
2
7
1
5
6
28
12
1K
3
6
22
50K
24
3
26
23
17
19
18
4
4
20
100K
-12V
31
1K
50K
-12V
25
48
+12V
1M
44
13
46
34
68K
(75K)
47
18K
45
1M
55
-12V
49
(75K)
68K
+12V
54
7
150
50
52
2
6
3
15
35
53
4
14
1M
-12V

LOGARITHMIC CIRCUIT WITH WIDE DYNAMIC RANGE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457), and may be manufactured and used by or for the Government for governmental purposes without the payment of any royalties thereon or therefor.

FIELD OF THE INVENTION

The present invention relates generally to a circuit for deriving an output voltage that is proportional to the logarithm of an input voltage susceptible to wide variations in amplitude and more particularly to a circuit that includes a constant current source for driving a non-linear element having a logarithmic output voltage versus input current response.

BACKGROUND OF THE INVENTION

It is well recognized that diodes forward biased above their saturation current have an exponential voltage versus current characteristic. This characteristic has been widely utilized in the past to enable a logarithmic output to be derived in response to an input signal. The use of a diode, per se, for deriving a logarithmic output signal is not susceptible for use in connection with signals having wide amplitude variations. This is because the impedance of a forward biased diode changes greatly as the diode voltage varies widely, resulting in significant variations in the loading of a source driving the diode. Of course, such variations are undesirable because they result in variations in the voltage applied by the source to the diode and inaccuracies in the logarithmic output response.

One conventional, prior art circuit for converting an input voltage (having a value $V_s$) to an output voltage that is proportional to the logarithm of the input voltage includes a DC operational amplifier having an inverting input terminal responsive to an input voltage, as coupled through a series resistor (having a value $R_1$). The inverting input terminal is also responsive to a negative feedback voltage that is coupled from the output of the amplifier through a diode having its cathode and anode respectively connected to the output and complementary input terminals. For accurate operation of this circuit, it is necessary for the current ($V_s/R_1$) supplied by the input voltage to the complementary input terminal to be much greater than $I_o$, the reverse saturation current of the feedback diode. Because of this requirement, the input voltage has a lower limit of 20 to 30 millivolts or the value of $R_1$ must be so low that the input voltage source is loaded. Because of the relatively high lower limit of the input voltage source, this prior art circuit has not been capable of handling wide variations in input voltages.

Other conventional logarithmic circuits exist, such as linear operational amplifiers combined with discrete transistor circuitry. However, these arrangements are for the purpose of limiting temperature dependence of the logarithmic circuits and the diode loading problems inherent with the previously described circuit are present.

Another prior art approach to increasing the dynamic range of input signals which a logarithmic circuit can handle is to use a constant current source which drives a high impedance input terminal of a differential amplifier which is shunted by a reverse biased diode, the impedance of which varies logarithmically as a function of the current flowing through it. Thereby, the voltage across the diode is proportional to the logarithm of the current flowing through it. The amplifier functions as a voltage follower, whereby the voltage across the diode is reflected at the output of the amplifier as a voltage proportional to the logarithm of the current flowing through the diode.

The constant current source used by these prior art devices is a PIN diode or a photomultiplier, either of which is positioned to respond to a modulated optical source. The optical source may be a constant intensity light source that is modulated by the density of photographic film or the like. In the alternative, a voltage source can be applied to a diode which produces light energy proportional to the current flowing through it. Light emitted from the current responsive diode is optically coupled to the PIN diode which derives an output current proportional to the light impinging on it. Hence, this prior art approach has obvious disadvantages in converting an input voltage to an output signal that is proportional to the logarithm of the input voltage, because of the requirement for current to optical energy transducers and optical energy to current transducers.

It is, accordingly, an object of the present invention to provide a new and improved circuit for converting input voltages susceptible to wide variations in amplitude to an output voltage that is proportional to the logarithm of the input voltage.

Another object of the invention is to provide a new and improved circuit utilizing only electric circuit components to convert an input voltage to an output voltage that is proportional to the logarithm of the input voltage over a wide range of the input voltage.

BRIEF DESCRIPTION OF THE INVENTION

In accordance with the present invention, there is provided a circuit for converting an input voltage to an output voltage that is proportional to the logarithm of the input voltage wherein an improved constant current generator feeds a non-linear element having a logarithmic current versus voltage characteristic. The improved constant generator includes an operational amplifier responsive to an input signal and a negative feedback voltage that is substantially equal to the input voltage and is subtracted by the amplifier from the input voltage. An output terminal of the operational amplifier is connected to a shunt circuit including a resistor that is connected in series circuit with the non-linear element, which is generally a diode forward biased by the output voltage of the operational amplifier. The current flowing through the resistor of the shunt circuit is proportional to the input voltage over a very wide range of input voltages; in one embodiment the current flowing through the resistor is directly proportional to the input voltage for voltages ranging from 1.0 millivolts to 10 volts.

The impedance presented by the constant current source to a source of the input voltage remains constant because of the isolation provided by the operational amplifier and the characteristics of the circuit for deriving the feedback voltage. In particular, the feedback voltage is directly proportional to the voltage developed across the resistor of the shunt circuit so that the feedback voltage approximates the voltage of the input signal source. The acceptable lower limit on the magnitude of the input voltage is determined only by properties of the amplifier, such as the offset voltage of the amplifier and its inherent noise level. The gain of the amplifier and feedback circuitry and the value of the resistor in the shunt circuit are selected such that the diode operates in the exponential portion of its voltage-current characteristic, and always above the saturation current of the diode.

A further feature of the invention relates to a circuit for compensating variations in the characteristics of the diode in the shunt circuit as a function of temperature. As is well known, voltage versus current characteristics of semiconductor diodes are dependent upon the temperature of the diode. Since the temperature variations change the logarithmic characteristics of the diode, the variations tend to affect the accuracy of the logarithmic relationship of the output voltage to the input voltage.

In the present circuit, compensation for the temperature variations is provided by physically locating a second diode, matched with and having the same characteristics as the first diode, close to the first diode so that they both have the same temperature variations. In particular, both diodes are mounted side-by-side on a common circuit board. The second diode is biased so that the voltage across it varies in the same manner as the voltage across the first diode in response to temperature changes. The voltages across the two diodes are combined to produce an output that is substantially independent of temperature variations of the first diode, by feeding the voltages across the two diodes to complementary input terminals of a differential amplifier.

It is, accordingly, still another object of the invention to provide a new and improved circuit for converting input voltages to output voltages that are proportional to the logarithm of the input voltages by utilizing a diode that is compensated for temperature variations to improve accuracy.

The above and still further objects, features and advantages of the present invention will become apparent upon consideration of the following detailed description of one specific embodiment thereof, especially when taken in conjunction with the accompanying drawing.

BRIEF DESCRIPTION OF THE DRAWING

The sole FIGURE of the drawing is a circuit diagram of a preferred embodiment of the invention.

DETAILED DESCRIPTION OF THE DRAWING

Reference is now made to the FIGURE wherein there is illustrated a constant current source 11 responsive to a source of DC voltage at terminal 12, which constant current source drives a non-linear element in the form of diode 13, which has a logarithmic relationship between the current flowing through it and the voltage developed across it. The voltage developed across diode 13 is an accurate indication of the logarithm of the voltage applied to terminal 12, for voltage variations over the four decade range from 1.0 millivolts to 10 volts. A DC, operational amplifier 14 is responsive to the voltage developed across diode 13 to develop a DC output voltage at terminal 15 that is proportional to the DC voltage at terminal 12.

Constant current source 11 comprises first and second cascaded, DC, operational feedback amplifiers 16 and 17, of the differential type. Non-inverting input terminal 18 of amplifier 16 is connected to a tap of a resistive voltage divider comprising resistors 19 and 20, the values of which are selected so that almost all of the voltage at terminal 12 is coupled to terminal 18. Output terminal 22 of amplifier 16 is connected to non-inverting input terminal 23 of amplifier 17 by a resistive voltage divider including resistors 24 and 25. Output terminal 26 of amplifier 17 is connected through resistor 27 to inverting input terminal 28 of amplifier 16, to provide a negative, DC feedback path for the voltage at terminal 18 of amplifier 16.

Connected in shunt with terminal 22 is resistor 31 that is series connected with diode 13. Amplifier 17 senses the voltage across resistor 31 since the non-inverting input terminal 23 is connected to one side of the resistor through resistor 24, and the tap between resistor 31 and diode 13 is DC coupled to inverting input terminal 32 of amplifier 17 through resistor 33. The voltage at the tap between resistor 31 and diode 13 is referenced to ground by the connection of the tap to ground through series connected resistors 34 and 35. The feedback arrangement is such that the voltages at terminals 18 and 28 are substantially equal to each other, and the output voltage at terminal 22 of amplifier 16 is substantially equal to the voltage at terminal 12. Thereby, the current flowing through resistor 31 has a value equal to $V_s/R_{31}$, wherein $V_s$ equals the voltage at terminal 12, and $R_{31}$ equals the value of resistor 31. The controlled current magnitude flowing through resistor 31 also flows through diode 13 to establish a voltage across the diode proportional to the logarithm of the voltage at terminal 12.

The accuracy with which the current flowing through resistor 31 and diode 13 is equal to $V_3/R_{31}$ is determined by the loop gain of the feedback circuit including amplifiers 16 and 17. The loop gain can be relatively large, consistent with the stability of the feedback circuit. The accuracy of the controlled current source in maintaining the current through resistor 31 and diode 13 is excellent with the component values indicated on the drawing.

The gains of amplifiers 16 and 17 are controlled by the values of the resistors connected to the input and output circuits thereof. In particular, the gain of amplifier 16 is determined by the values of resistors 19, 20 and 27, as well as feedback resistor 36 that is connected in a negative feedback path between output terminal 22 and inverting input terminal 28 of the amplifier. The gain of amplifier 17 is controlled by resistors 24, 25 and 33, as well as resistor 37, that is connected in a negative feedback path between output terminal 26 and inverting input terminal 32 of the amplifier. Connected in parallel with resistor 36 in the negative feedback path of amplifier 16 are back biased diode 38, that prevents possible latch-up of amplifier 16, and capacitor 39, that provides high frequency stability, if needed.

The lowest voltage at terminal 12 which the circuit can process is limited only by the noise of amplifier 16 and by an offset voltage supplied to inverting input terminal 28 to assure that diode 13 is forward biased by the output voltage at terminal 22 of amplifier 16 so that the diode always functions in its logarithmic output voltage versus input current region, above the diode saturation current. The offset voltage applied to terminal 28 is controlled by adjusting the offset output voltage at terminal 26 of amplifier 17 by adjustment of potentiometer slider 41, connected to negative DC power supply that is coupled by potentiometer 42 to amplifier 17.

The logarithmic input current versus output voltage characteristic of diode 13 is affected by the temperature of the diode. To prevent the temperature of the diode from affecting the accuracy of the voltage derived at terminal 15, a temperature compensation circuit is provided. The temperature compensation circuit includes diode 44, having characteristics matched with those of diode 13. Diodes 13 and 44 are mounted in side-by-side relationship on a common printed circuit board 45 so that both diodes experience common ambient temperature variations. Diode 44 is biased by positive and negative DC power supply sources at terminals 46 and 47, respectively, which forward bias the diode through resistors 48, 49 and 50. The values of the resistors and power supply voltages are selected so that the anode of diode 44 is maintained at a zero volt DC level. Thereby, there are common temperature variations of diodes 13 and 44, and the voltage across diode 44 varies in the same manner as the voltage across diode 13 in response to the temperature variations.

The voltages across diodes 13 and 44 are combined so that the voltage at terminal 15 is substantially independent of the temperature of diode 13. To this end, the voltages developed across diodes 13 and 44 are respectively supplied through equal valued resistors 34 and 52 to the non-inverting and inverting terminals 53 and 54 of amplifier 14. Ground stabilization for the signal applied to the inverting input terminal 53 of amplifier 14 is provided by resistor 35. A negative feedback path is provided through resistor 55 between the output terminal 15 and inverting input terminal 54 of amplifier 14 through resistor 55 to provide stabilization for amplifier 14.

Because the impedance of diode 13 is not reflected back to the input terminals of amplifier 16, the impedance seen by the source connected to terminal 12 is determined exclusively by the values of resistors 19 and 20 and the source is not loaded by diode 13. By appropriately selecting the value of resistor 31, the current driving diode 13 can be set to a desired value for any value of the voltage at terminal 12, provided amplifier 16 can produce the current which is needed to flow through resistor 31 and diode 13. Therefore, upon selection of the lower limit for the voltage at terminal 12, diode 13 can be set to an appropriate "cut-on" level. The voltage at terminal 12 is converted to a voltage at terminal 15 that is logarithmically related to the voltage at terminal 12 over a wide dynamic range.

While there has been described and illustrated one specific embodiment of the invention, it will be clear that variations in the details of the embodiment specifically illustrated and described may be made without departing from the true spirit and scope of the invention as defined in the appended claims.

What is claimed is:

1. A circuit for deriving an output voltage that is proportional to the logarithm of an input voltage susceptible to wide variations in amplitude comprising a constant current source, said constant current source including: an amplifier having an input terminal connected to be responsive to the input voltage and an output terminal, a resistor connected in a shunt DC circuit with the output terminal, a DC negative feedback path between the output terminal and an input terminal of the amplifier, a non-linear element connected in a DC series circuit with the resistor as part of the shunt circuit, said feedback path including means for sensing the voltage across the resistor and for supplying an input terminal of the first amplifier with a negative feedback voltage that is responsive to the sensed voltage and substantially equal to the input voltage as coupled to the input terminal, said feedback voltage being subtracted by the amplifier from the input voltage as coupled to the input terminal, said sensing means including means for subtracting the combined voltage across the resistor and the non-linear element from the voltage across the element, and said non-linear element having a logarithmic output voltage versus input current response for all currents flowing through the resistor over the wide range of variations of the input voltage, whereby a voltage proportional to the input voltage is developed across the element.

2. The circuit of claim 1 wherein the means for subtracting includes a second amplifier cascaded with the output terminal and for deriving the negative feedback signal.

3. The circuit of claim 1 wherein the element comprises a diode forward biased by the DC voltage at the output terminal so that the diode operates in the exponential portion of its voltage versus current characteristic above its saturation current.

4. The circuit of claim 3 wherein the diode is susceptible in variations in its voltage versus current characteristic as a function of temperature, means for compensating for the variations caused by temperature, said compensating means including another diode matched to and maintained at the same temperature as the diode of the element, means for biasing the other diode so that the voltage across it varies in the same manner as the voltage across the diode of the element in response to temperature changes, and means for combining the voltages across the diode of the element and the other diode to produce an output substantially independent of the temperature of the diode of the element.

* * * * *